United States Patent [19]
Gris et al.

[11] Patent Number: 6,114,918
[45] Date of Patent: Sep. 5, 2000

[54] LOW PHASE-NOISE DEVICE COMPRISING A MICROSTRIP-MOUNTED COAXIAL DIELECTRIC RESONATOR AND METHOD OF REDUCING THE PHASE NOISE IN SUCH A DEVICE, IN PARTICULAR IN A VOLTAGE-CONTROLLED OSCILLATOR

[75] Inventors: Marco Gris, Milan; Roberto Tosini, Ronco Briantino; Graziano Vigano, Biassono; Alberto Villa, Varese, all of Italy

[73] Assignee: Alcatel, Paris, France

[21] Appl. No.: 09/348,002

[22] Filed: Jul. 6, 1999

[30] Foreign Application Priority Data

Jul. 9, 1998 [IT] Italy ................................. MI98A1563

[51] Int. Cl.[7] ..................................................... H03B 5/18
[52] U.S. Cl. .............................................. 331/96; 331/99
[58] Field of Search ..................... 331/96, 99, 107 DP, 331/107 SL, 107 C, 117 D, 177 V, 108 C, 108 D; 257/394, 395, 396, 275, 277; 333/246, 247

[56] References Cited

U.S. PATENT DOCUMENTS

| | | | |
|---|---|---|---|
| 4,871,983 | 10/1989 | Graycar | 331/96 |
| 5,124,675 | 6/1992 | Komazaki et al. | 333/204 |
| 5,742,091 | 4/1998 | Hebert | 257/531 |
| 5,834,981 | 11/1998 | Trier et al. | 331/99 |
| 6,011,446 | 1/2000 | Woods | 331/185 |

FOREIGN PATENT DOCUMENTS 0 519 080 A1 12/1992 European Pat. Off. .

OTHER PUBLICATIONS

P.C. Kandpal et al, "A Broadband VCO Using Dielectric Resonators", 19888 IEEE MTT International Microwave Symposium Digest, vol. 2, May 25, 1988, pp. 609–612, XP002116907.

D. I. Pollidi, Design Method for a Coxial–Resonator Oscillator, RF Design, vol. 18, No. 10, Oct. 1, 1995 pp. 66, 68 XP000548232.

*Primary Examiner*—Benny Lee
*Assistant Examiner*—Henry Choe
*Attorney, Agent, or Firm*—Sughrue, Mion, Zinn, Macpeak & Seas, PLLC

[57] ABSTRACT

A low phase-noise device, like e.g. a microstrip-mounted voltage-controlled oscillator (VCO) is described, and also a method of reducing such a noise in such devices or other devices comprising a microstrip-mounted coaxial ceramic resonator. In practice, a recess is made in the metallic support, opening towards the substrate, extending beneath the terminal area of the ceramic resonator or, possibly, even beyond it. Said recess is filled with air and the layer of electrically conducting material between the substrate and the metallic support at said recess is removed.

13 Claims, 2 Drawing Sheets

LOW PHASE-NOISE DEVICE COMPRISING A MICROSTRIP-MOUNTED COAXIAL DIELECTRIC RESONATOR AND METHOD OF REDUCING THE PHASE NOISE IN SUCH A DEVICE, IN PARTICULAR IN A VOLTAGE-CONTROLLED OSCILLATOR

BACKGROUND OF THE INVENTION

1. Field of the Invention

The present invention relates to the field of the electronic equipments and in particular it concerns a low phase-noise device, like e.g. a voltage-controlled oscillator mounted on microstrip, and a method of reducing such noise in such devices or other devices comprising a microstrip-mounted coaxial ceramic resonator.

2. Background Information

In a microstrip- mounted low-noise voltage-controlled oscillator (VCO) wherein a section of ceramic coaxial transmission line is used for simulating a high-Q (figure of merit) inductor, it is known that the phase noise characteristic can be seriously affected by the parasitic capacitance existing between the resonator terminal area and the ground plane. The problem is particularly evident where the tuning range of the oscillator is small i.e. when the varactor diode, being weakly fixed to the resonator, scarcely affects the phase noise. Naturally, the situation even worsen when a low-cost epoxy resin substrate with a rather high dielectric constant is used, wherein the parasitic capacitance is higher and the figure of merit Q is rather small.

Hence the technical problem to be solved in practice consists in providing a practical and effective system for reducing the unavoidable parasitic capacitance, and for assuring that its Q is as high as possible, well greater than allowed by the substrate losses so as not to excessively impair the overall figure of merit of the resonant circuit and thus the phase noise of the oscillator.

A known solution to such a problem provides for mounting the critical components in a risen fashion or "in the air". In other words, according to this known solution, the two coupling capacitors, one being connected to the active device and the other being connected with the varactor diode, are directly soldered between the terminal of the resonator and the respective lands of the printed circuit without touching the substrate surface. In this way it is clear that, disposed in series with the low-Q capacitance, represented by the substrate, is a second capacitance disposed between the resonator terminal and the upper face of the microstrip circuit which, having the air as dielectric medium, takes on a very small value with respect to the first one and is characterized by low losses. On the other hand, it is easy to verify that the combination of the above two capacitances can be represented by a single equivalent parasitic capacitance whose characteristics are close to those of the sole air capacitance; as a result, a remarkable reduction of the parasitic capacitance to ground is obtained in parallel with the resonator and the figure of merit is increased. Although this solution substantially solves the above-mentioned problem, it raises evident problems of practical and functional nature since it requires a manual positioning and soldering of the two small capacitors (operations which are obviously time-consuming, uneasy and expensive). In addition, the resonator terminal should be slightly shortened by way of hand mechanical operations which are still time consuming, inaccurate, often jeopardize irremediably the terminal itself and, last but not least, they prevent the mounting operations from being automated.

SUMMARY OF INVENTION

In view of the above problems and of the not completely sufficient prior art solutions, the object of the present invention is to provide a low phase-noise device, like e.g. a microstrip-mounted voltage-controlled oscillator, and a method of reducing such a noise in these devices or in other devices comprising a microstrip-mounted coaxial ceramic resonator. This object is brilliantly achieved by a device as set forth in the independent claim 1 and a method having the features set forth in the independent claim 9. Further advantageous characteristics of the invention are set forth in the respective dependent claims.

The principle, which the present invention is based on, substantially is to increase the distance between the ground plane and the terminal of the resonator by means of a small air-filled recess, made in the metallic support beneath the printed circuit board.

The present invention will certainly result in being clear, from the following description, to be read with reference to the figures of the attached drawings, which are given only by way of an esemplificative and non-limiting example.

DETAILED DESCRIPTION OF THE PREFERRED EMBODIMENT

Figure 1:
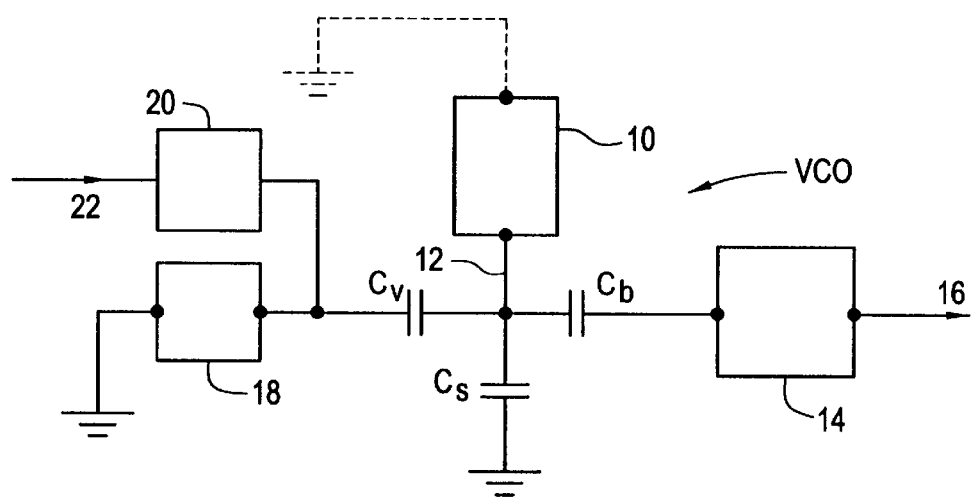
FIG. 1 shows a circuit diagram of the critical components of a device according to the present invention.

First, it is advisable to point out that the following description relates to a voltage-controlled oscillator (briefly VCO) only in order not to make the description itself unnecessarily long and confused but such a choose should not be interpreted as an invention limitation. Furthermore, like reference numerals have been used throughout the several views to designate identical or functionally equivalent components.

FIG. 1 diagrammatically shows a conventional voltage-controlled oscillator, usually abbreviated to VCO. It comprises: a resonator 10 with a terminal 12, an active device 14 with signal output 16, a grounded varactor diode 18, an RF decoupling network (block 20) connected with a control voltage 22, a first capacitor having capacitance Cb connected to the active component or device 14 and a second capacitor having capacitance Cv connected to the varactor diode 18. The parasitic capacitance is represented by a further capacitor having capacitance Cs.

Figure 2:
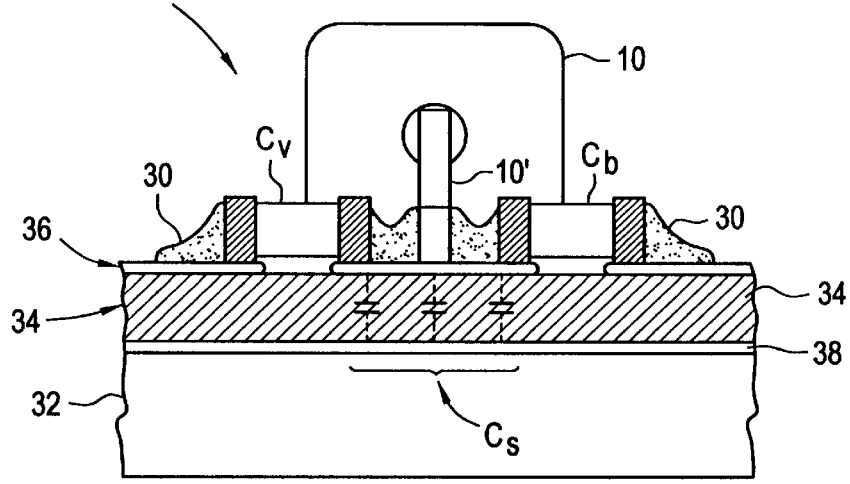
FIG. 2 illustrates a partial cross section of a conventional arrangement of the critical components.

FIG. 2 shows, in a partial cross-sectional view, the conventional arrangement of the components indicated in FIG. 1. In addition, solder points 30, the metallic support 32, the substrate 34 constructed of dielectric material provided with an upper 36 and lower 38 thin layers of copper or any other electrical conducting material have been indicated.

Figure 3:
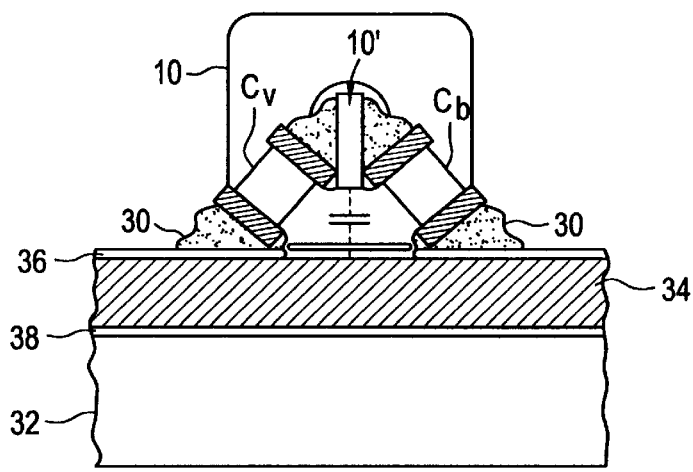
FIG. 3 illustrates a cross section of a known and improved arrangement of the critical components.

FIG. 3 illustrates how the various components were arranged in the prior art solution in an attempt to overcome the problems solved with the present invention and mentioned above. In this solution the two capacitors, the one connected to the active device and the one connected to the varactor diode, are directly soldered to the resonator terminal 10' without contacting the surface of the substrate thus obtaining a satisfactory result, although with the problems mentioned above.

On the contrary, the characteristic features of the present invention will be illustrated hereinafter with reference to FIGS. 4 and 5. As it can be easily and readably perceived, the substantial difference (please compare FIGS. 2 and 5) consists in having made a recess 40 of suitable size and depth in the metallic support 32 of the microstrip circuit, fundamentally beneath the area of the printed circuit connecting the resonator terminal with its coupling capacitors. Obviously the copper layer of the lower face 38 is removed thus creating a window 42 and the recess 40 is filled with air. With this contrivance the ground plane is substantially spaced out from the resonator terminal and consequently the parasitic capacitance to ground in parallel with the resonator is reduced and its figure of merit Q is increased.

Figure 4:
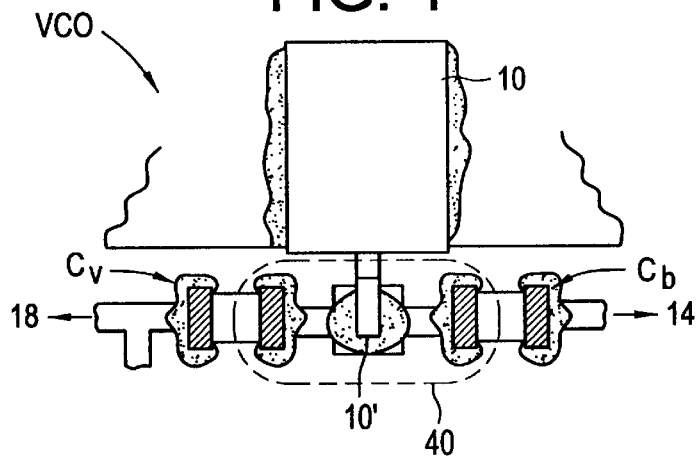
FIG. 4 shows a plan view of the arrangement according to the present invention, with the hidden parts being represented by a dashed line.
Figure 5:
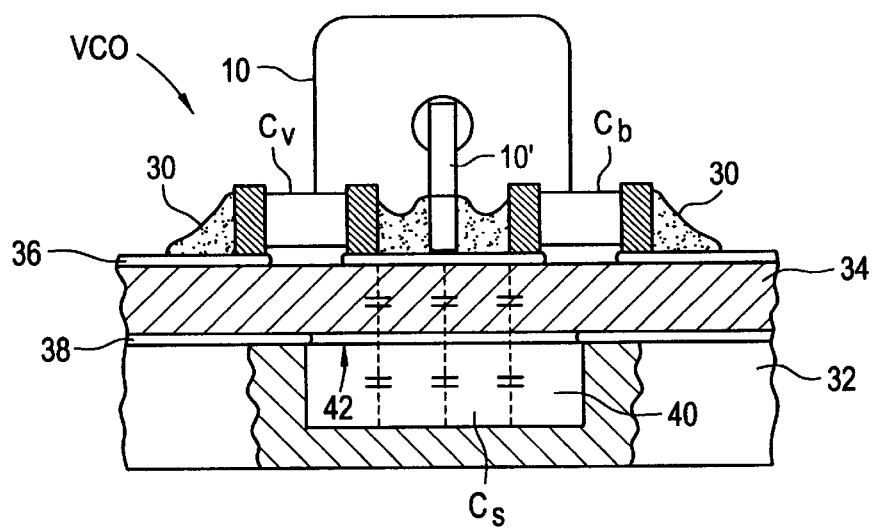
FIG. 5 is a cross-sectional view thereof.

As it is clear from FIG. 4 in a first embodiment of the invention, the recess is made beneath the resonator terminal and the two coupling capacitors. A further embodiment (FIG. 6) provides for the realization of said recess in a larger area, i.e. beneath the active device and varactor diode areas.

It has been discovered that the reduction of parasitic capacitance beneath the varactor diode widens the tuning range of the oscillator in a non-negligible manner; the range widening however is obtained without the need to increase the coupling between varactor and resonator (which would adversely affect the phase noise characteristic).

In the case where the microstrip circuit is without metallic support, it would be possible to obtain the same results as the above embodiments by providing a small metallic hollow cover soldered to the lower face of the electrical conducting material of the substrate substantially beneath the terminal area of the resonator. The recess of said cover must obviously face the substrate so as to realize the recess shown in FIGS. 4 to 6 and part of the copper layer on the lower face 38 is removed to create a window 42. For simplicity, the word "support" in this description has been, and will be, used to indicate not only a real support, but also a cover like the above one that can be considered as a small-size support. The metallic cover could be applied directly on the lower face 38 or could also be housed in a suitable and corresponding recess made in a support 32 of a non-metallic material to be joined with the substrate 34.

At any rate, in order to avoid possible increase in microphone effect due to the fact that the critical area of the board without underlying metallic support acts as a floating diaphragm, it is advisable to assure that the recess is closed with a conducting wall having a significant thickness. It is believed that the best results are achieved when the recess depth is at least twice the substrate thickness. In fact, under these conditions, and assuming that the relative dielectric constant of the substrate is 2.5 (polytetrafluoroethylene-and fiberglass-based "soft" materials), the equivalent parasitic capacitance should not exceed about one fifth of the original one, i.e. of that due to the substrate only. It is however pointed out that, in the case where the internal depth of the recess has a value which is different from the indicated one, for instance it is half of the altitude indicated above, satisfactory values are obtained anyway. Therefore, in other words, it can be said that the above-mentioned depth value gives optimal results beyond which substantial benefits are not achieved.

At this point the advantages of the present invention over the known art are clear, that is to say the achievement of a substantial reduction of the phase noise still maintaining the possibility of mounting the various components on a printed circuit board and soldering them thereto in an automated and precise manner.

By way of example and in order to stress once more the advantages of the present invention, the results obtained with two different series of VCO operating in the range of 2 GHz are given: the phase noise measured at the offset frequency of 10 KHz has changed from −100 dBc/Hz to less than −104 dBc/Hz with a first type of VCO, and from −105/106 dBc/Hz to −110/111 dBc/Hz (with peaks of even −113/114 dBc/Hz) in more recent versions.

Figure 6:
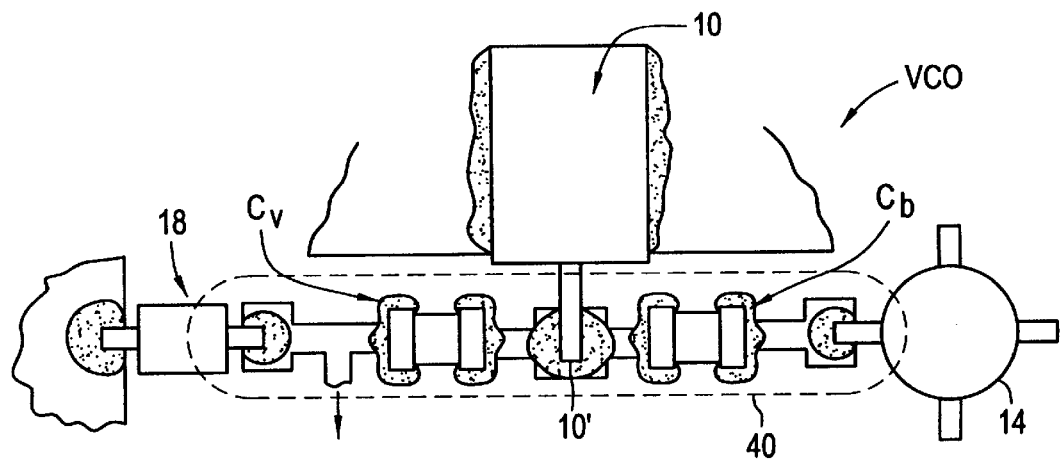
FIG. 6 is similar to FIG. 4 but it concerns a modified arrangement or arrangement with an extended recess.

It is stressed that, notwithstanding the present invention has been described with special reference to a low-noise VCO, it is well applicable to fixed oscillators with ceramic coaxial resonator (without varactor diode), filters with ceramic coaxial resonators mounted on printed circuit board (such a situation could be similar to what it is shown in FIG. 6, thinking of replacing the active circuit and varactor with other resonators whose whole number is equal to the order of the filter itself) and to any other device in which high-Q dielectric resonators are to be mounted on microstrip.

Therefore, the concepts set forth above are intended as extendable entirely to, and valid for, such devices, the scope of the invention being solely defined by the following claims.

We claim:

1. An electrical device comprising at least one coaxial dielectric resonator mounted on microstrip; a substrate of non conductive dielectric material with first and second faces constructed of electrically conducting material; and a support, said resonator being mounted on the first face of said substrate, said support being fixed to the second face of said substrate, wherein said support comprises a recess opening towards said substrate, made at least substantially at said resonator, with the second face of electrically conductive material being removed or broken at least substantially at said recess to form a window, to thereby decrease parasitic capacitance between said resonator and ground.

2. A device according to claim 1, wherein said support is constructed of an electrically conducting material.

3. A device according to claim 1, wherein that said support is constructed of a non-conductive dielectric material and comprises a cover of an electrically conducting material housed in said recess.

4. A device according to claim 1, wherein the altitude or depth of said recess is preferably twice the thickness of the substrate.

5. A device according to claim 1, wherein it further comprises a varactor diode, an active device with respective joints, and a pair of coupled capacitors.

6. A device according to claim 5, wherein said recess extends up to said varactor diode and active device joints.

7. A device according to claim 1, wherein the extension of said recess substantially corresponds to the extension of said window in the second face of electrically conducting material.

8. A method of reducing the phase noise in a device comprising at least one microstrip-mounted coaxial dielectric resonator; said device further comprising a substrate of non-conductive dielectric material with first and second faces constructed of electrically conducting material and a support, said at least one resonator being mounted on the first face of said substrate, said support being fixable to the second face of said substrate, wherein the method comprises the step of making, in said support a recess opening towards said substrate and extending at least substantially at said at least one resonator, and making a window in said electrically conductive material at least substantially at said recess, to thereby decrease parasitic capacitance between said resonator and ground.

9. A method according to claim 8, wherein it further comprises the step of housing a cover of an electrically conducting material in said recess of the support.

10. A method according to claim 8, wherein it further comprises the step of filling said recess, or the cover housed therein, with air or a substantially equivalent dielectric medium.

11. A method according to claim 8, wherein the altitude or depth of said recess is equal to about twice the thickness of the substrate.

12. A method according to claim 8, wherein said device is a microstrip-mounted voltage-controlled oscillator.

13. A method according to claim 8, wherein said device is a filter comprising a number of coaxial dielectric resonators equal to the order of the filter itself.

* * * * *